United States Patent
Nakagawa

(10) Patent No.: US 12,376,398 B2
(45) Date of Patent: Jul. 29, 2025

(54) SOLID-STATE IMAGING ELEMENT AND ELECTRONIC APPARATUS

(71) Applicant: SONY SEMICONDUCTOR SOLUTIONS CORPORATION, Kanagawa (JP)

(72) Inventor: Haruyuki Nakagawa, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 20 days.

(21) Appl. No.: 18/094,269

(22) Filed: Jan. 6, 2023

(65) Prior Publication Data

US 2023/0154952 A1    May 18, 2023

Related U.S. Application Data

(63) Continuation of application No. 16/607,028, filed as application No. PCT/JP2018/004875 on Feb. 13, 2018, now Pat. No. 11,587,963.

(30) Foreign Application Priority Data

Apr. 28, 2017  (JP) .................. 2017-090536

(51) Int. Cl.
   *H10F 39/00*  (2025.01)
(52) U.S. Cl.
   CPC ................ *H10F 39/80373* (2025.01)
(58) Field of Classification Search
   CPC ........ H01L 27/14603; H01L 27/14614; H01L 27/14638; H01L 29/4236; H01L 39/80373
   See application file for complete search history.

(56) References Cited

U.S. PATENT DOCUMENTS

2006/0084195 A1  4/2006  Lyu
2009/0303371 A1* 12/2009 Watanabe ......... H01L 27/14603
                                                    348/311

(Continued)

FOREIGN PATENT DOCUMENTS

CN    102917179 A    2/2013
JP    2016-136584    7/2001

(Continued)

OTHER PUBLICATIONS

International Search Report for International (PCT) Patent Application No. PCT/JP2018/004875, dated Apr. 17, 2018, 7 pages.

(Continued)

*Primary Examiner* — Peter M Albrecht
(74) *Attorney, Agent, or Firm* — Sheridan Ross PC

(57) ABSTRACT

To enhance a charge transfer efficiency in a transfer gate having a vertical gate electrode. A solid-state imaging element includes a photoelectric conversion section, a charge accumulating section, and a transfer gate. The photoelectric conversion section is formed in a depth direction of a semiconductor substrate, and generates charges corresponding to a quantity of received light. The charge accumulating section accumulates the charges generated by the photoelectric conversion section. The transfer gate transfers the charges generated by the photoelectric conversion section to the charge accumulating section. The transfer gate includes a plurality of vertical gate electrodes which is filled to a predetermined depth from an interface of the semiconductor substrate, and at least a part of a diameter is different in the depth direction of the semiconductor substrate.

8 Claims, 18 Drawing Sheets

(56) References Cited

U.S. PATENT DOCUMENTS

| | | |
|---|---|---|
| 2012/0199882 A1 | 8/2012 | Shin |
| 2013/0032919 A1 | 2/2013 | Watanabe |
| 2013/0193496 A1 | 8/2013 | Hisanori |
| 2013/0307040 A1 | 11/2013 | Ahn et al. |
| 2014/0252420 A1 | 9/2014 | Yi et al. |
| 2014/0312391 A1* | 10/2014 | Ihara ............... H01L 27/14614 |
| | | 257/229 |
| 2015/0279883 A1 | 10/2015 | Manouvrier |
| 2016/0020237 A1 | 1/2016 | Yamakawa |
| 2016/0086984 A1 | 3/2016 | Wang et al. |
| 2016/0218138 A1 | 7/2016 | Oishi |
| 2016/0247847 A1 | 8/2016 | Ueda et al. |
| 2017/0069672 A1* | 3/2017 | Jin .................... H01L 27/14614 |
| 2018/0061875 A1* | 3/2018 | Roy ................. H01L 27/14614 |
| 2020/0135781 A1 | 4/2020 | Nakagawa |

FOREIGN PATENT DOCUMENTS

| | | | | |
|---|---|---|---|---|
| JP | 2006121093 A | 5/2006 | | |
| JP | 2010-114273 | 5/2010 | | |
| JP | 2013-026264 | 2/2013 | | |
| JP | 2013-038118 | 2/2013 | | |
| JP | 2015-053411 | 3/2015 | | |
| JP | 2016-152377 | 8/2016 | | |
| JP | 2016-162788 | 9/2016 | | |
| KR | 20060108017 A | * | 10/2006 | ....... H01L 27/14614 |
| KR | 20120090352 A | 8/2012 | | |
| KR | 20140111492 A | 9/2014 | | |
| WO | WO 2017/057278 | 4/2017 | | |

OTHER PUBLICATIONS

Official Action for U.S. Appl. No. 16/607,028, dated Dec. 10, 2020, 9 pages. Restriction Requirement.

Official Action for U.S. Appl. No. 16/607,028, dated Mar. 19, 2021, 11 pages.

Official Action for U.S. Appl. No. 16/607,028, dated Jul. 22, 2021, 7 pages.

Official Action for U.S. Appl. No. 16/607,028, dated Dec. 7, 2021, 9 pages.

Official Action for U.S. Appl. No. 16/607,028, dated Apr. 18, 2022, 11 pages.

Official Action for U.S. Appl. No. 16/607,028, dated Jul. 28, 2022, 9 pages.

Notice of Allowance for U.S. Appl. No. 16/607,028, dated Oct. 6, 2022, 8 pages.

* cited by examiner a b

TAPERED SHAPE a

VERTICAL SHAPE b a b c a b

SOLID-STATE IMAGING ELEMENT AND ELECTRONIC APPARATUS

CROSS REFERENCE TO RELATED APPLICATIONS

This application is a continuation of U.S. patent application Ser. No. 16/607,028, filed Oct. 21, 2019, which is a national stage application under 35 U.S.C. 371 and claims the benefit of PCT Application No. PCT/JP2018/004875 having an international filing date of 13 Feb. 2018, which designated the United States, which PCT application claimed the benefit of Japanese Patent Application No. 2017-090536 filed 28 Apr. 2017, the entire disclosures of which are incorporated herein by reference.

TECHNICAL FIELD

The present technology relates to a solid-state imaging element and an electronic apparatus. More particularly, the present technology relates to a solid-state imaging element in which a transfer gate has a vertical gate electrode and an electronic apparatus including the solid-state imaging element.

BACKGROUND ART

Heretofore, in a CMOS type solid-state imaging element (CMOS image sensor), in order to increase an amount of charges which can be accumulated in a photodiode which performs photoelectric conversion in a pixel section, a potential such that the charges can be accumulated to a deep region has been formed in some cases. In such a case, a normal transfer gate is not used, but a vertical gate electrode which is inserted into silicon is used, resulting in that to a deep region is modulated to perform the reading operation with a generated electric field. In addition, in order to increase a modulation power, a structure is also proposed in which a plurality of vertical gate electrodes is adopted (e.g., refer to PTL 1 to PTL 3).

CITATION LIST

Patent Literature

[PTL 1]
JP 2010-114273A
[PTL 2]
JP 2016-136584A
[PTL 3]
JP 2015-053411A

SUMMARY

Technical Problem

In the related art described above, the vertical gate electrode is used in the transfer gate, resulting in that the reading operation with the generated electric field is performed. However, since the vertical gate electrode itself is at the same potential, the extension of a length of the vertical gate electrode results in that it becomes difficult to generate the electric field in a depth direction. On the other hand, the related art described above also proposes that a semiconductor region is divided into a plurality of regions, and in a position closer to a substrate surface, an impurity concentration becomes high. In this case, however, there is a problem that the number of processes is increased.

The present technology has been created in the light of such a situation, and it is therefore desirable to enhance charge transfer efficiency in a transfer gate having a vertical gate electrode.

Solution to Problem

The present technology is created in order to solve the problem described above, and a first aspect thereof is a solid-state imaging element, and an electronic apparatus including the solid-state imaging element. In this case, the solid-state imaging element includes: a photoelectric conversion section formed in a depth direction of a semiconductor substrate and generating charges corresponding to a quantity of received light; a charge accumulating section accumulating the charges generated by the photoelectric conversion section; and a transfer gate transferring the charges generated by the photoelectric conversion section to the charge accumulating section, in which the transfer gate includes a plurality of vertical gate electrodes which is filled to a predetermined depth from an interface of the semiconductor substrate and at least a part of a diameter is different in a depth direction of the semiconductor substrate. As a result, there is brought an operation in which the electric field is applied to the vicinity of the vertical gate electrode, so that the charges in the photodiode are efficiently transferred to a floating diffusion.

In addition, in the first aspect, the plurality of vertical gate electrodes may have a shape whose diameter becomes small in the depth direction of the semiconductor substrate. In this case, the plurality of vertical gate electrodes may have the shape whose diameter becomes small at a taper ratio of 0.02 or more in the depth direction of the semiconductor substrate.

In addition, in the first aspect, the plurality of vertical gate electrodes may have a shape whose diameter is not changed to a given depth of the semiconductor substrate, and the diameter becomes small in the depth direction from the given depth. In addition, the plurality of vertical gate electrodes may have a shape whose diameter becomes small in the depth direction to the given depth of the semiconductor substrate, and the diameter may not be changed from the given depth.

In addition, in the first aspect, the plurality of vertical gate electrodes may have a shape in which a central portion in the depth direction of the semiconductor substrate swells, and a shallow portion and a deep portion may be thin.

In addition, in the first aspect, the plurality of vertical gate electrodes may have a shape in which the diameter becomes small in steps in the depth direction of the semiconductor substrate.

In addition, in the first aspect, the plurality of vertical gate electrodes may have a shape in which lengths thereof in the depth direction of the semiconductor substrate are different from one another.

In addition, in the first aspect, the plurality of vertical gate electrodes may have a shape in which a cross section along a diameter has a polygonal shape.

In addition, in the first aspect, a gate electrode of the transfer gate may be electrically separated from one another so as to correspond to the plurality of vertical gate electrodes, respectively.

In addition, in the first aspect, the plurality of vertical gate electrodes may have a shape whose parts are connected to one another to have a squared U-shape in cross section, and in which a cross-sectional area thereof becomes small in the depth direction of the semiconductor substrate.

In addition, in the first aspect, the plurality of vertical gate electrodes may form a donut cylindrical shape, and may have a shape whose cross-sectional area becomes small in the depth direction of the semiconductor substrate.

Advantageous Effect of Invention

According to the present technology, an excellent effect can be offered in which in the transfer gate having the vertical gate electrode, the charge transfer efficiency can be enhanced. It should be noted that the effect described here is by no means necessarily limited, and any of the effects described in the present disclosure may also be offered.

DESCRIPTION OF EMBODIMENT

Figure 1:
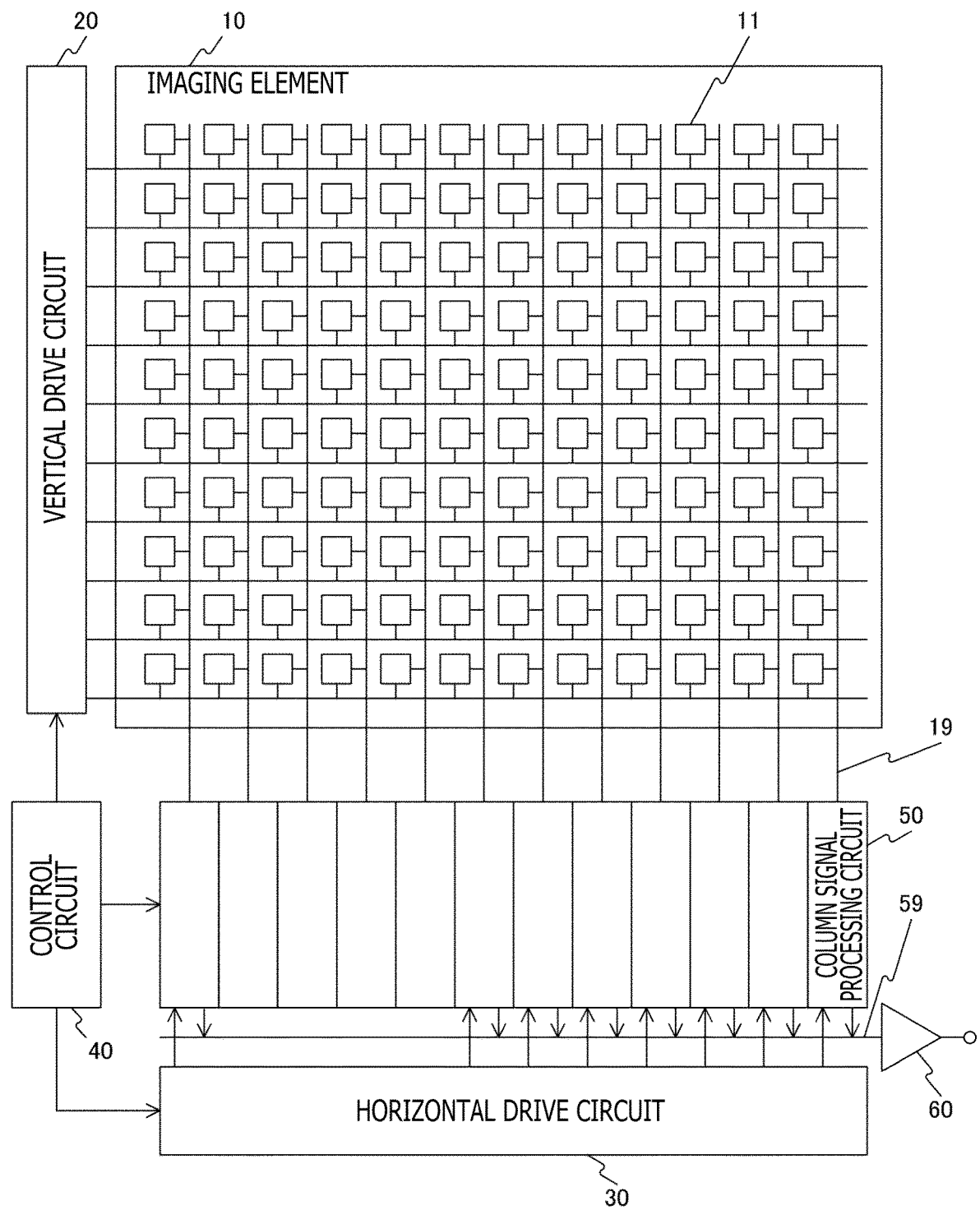
FIG. 1 is a block diagram depicting an example of a configuration of an electronic apparatus as an example of a semiconductor apparatus having an imaging element in an embodiment of the present technology.

Hereinafter, a mode for carrying out the present technology (hereinafter, referred to as an embodiment) will be described. A description is given in accordance with the following order.
1. Embodiment
2. Modified Changes Embodiment (Configuration of Electronic Apparatus)
FIG. 1 is a block diagram depicting an example of a configuration of an electronic apparatus as an example of a semiconductor apparatus having an imaging element in an embodiment of the present technology. The electronic apparatus includes an imaging element 10 and a peripheral circuit section. The peripheral circuit section includes a vertical drive circuit 20, a horizontal drive circuit 30, a control circuit 40, a column signal processing circuit 50, and an output circuit 60.

The imaging element 10 is a pixel array in which a plurality of pixels 11 each including a photoelectric conversion section is arranged in the two-dimensional array. The pixel 11 includes, for example, a photodiode becoming the photoelectric conversion section, and a plurality of pixel transistors. Here, a plurality of pixel transistors, for example, can include three transistors: a transfer transistor; a reset transistor; and an amplification transistor.

The vertical drive circuit 20 drives the pixels 11 in units of a row. The vertical drive circuit 20, for example, includes a shift register. The vertical drive circuit 20 selects a pixel drive wiring, and supplies a pulse for driving the pixels 11 to the selected pixel drive wiring. As a result, the vertical drive circuit 20 successively selectively scans the pixels 11 of the imaging element 10 in a vertical direction in units of a row, and supplies pixel signals based on signal charges generated in response to a quantity of received light in the photoelectric conversion sections of the pixels 11 to the column signal processing circuit 50.

The horizontal drive circuit 30 drives the column signal processing circuit 50 in units of a column. The horizontal drive circuit 30, for example, includes a shift register. The horizontal drive circuit 30 successively outputs a horizontal scanning pulse, thereby selecting the column signal processing circuits 50 to cause the pixel signals to be outputted from the column signal processing circuits 50 to a horizontal signal line 59.

The control circuit 40 controls the whole of the solid-state imaging apparatus. The control circuit 40 receives an input clock and data used to instruct an operation mode or the like, and outputs data such as internal information in the solid-state imaging apparatus. That is, the control circuit 40 generates a clock signal and a control signal each becoming a reference of operations of the vertical drive circuit 20, the column signal processing circuit 50, the horizontal drive circuit 30, and the like on the basis of a vertical synchronous signal, a horizontal synchronous signal, and a master clock. Then, the control circuit 40 inputs these signals to the vertical drive circuit 20, the column signal processing circuit 50, the horizontal drive circuit 30, and the like.

The column signal processing circuit 50, for example, is arranged every column of the pixels 11, and executes signal processing such as noise removal every pixel column for the signals outputted from the pixels 11 for one row. That is, the column signal processing circuit 50 executes the signal processing such as CDS, signal amplification, or AD conversion for removing a fixed pattern noise peculiar to the pixel 11. A horizontal selection switch (not depicted) is connected between an output stage of the column signal processing circuit 50, and the horizontal signal line 59.

The output circuit 60 executes signal processing for the signals which are successively supplied from the column signal processing circuits 50 through the horizontal signal line 59, and outputs the resulting signals. In this case, the output circuit 60 buffers the signals from the column signal processing circuits 50. In addition, the output circuit 60 may execute black level adjustment, column dispersion correction, various kinds of digital signal processing, and the like for the signals from the column signal processing circuits 50.

(Structure of Imaging Element)

Figure 2:
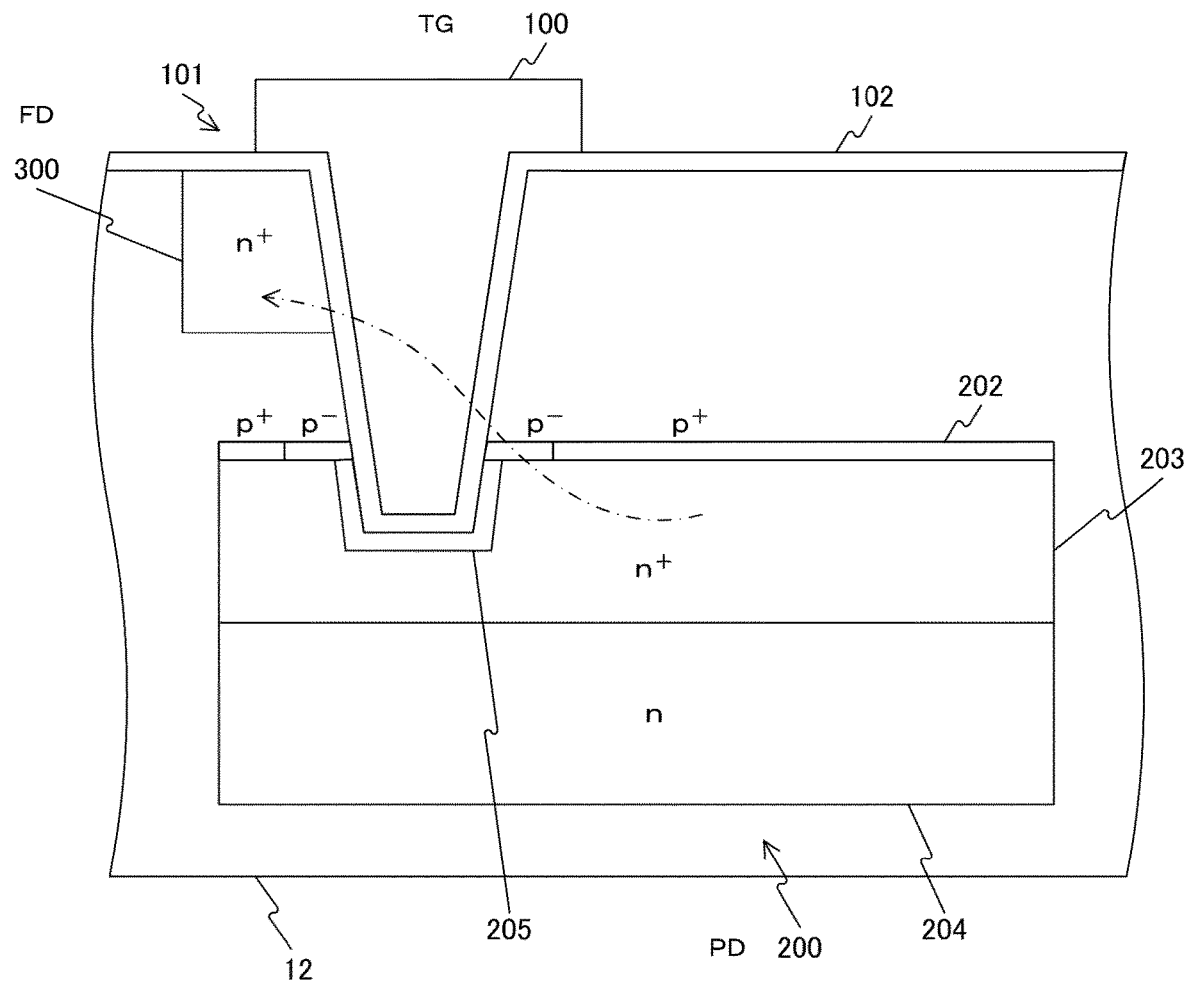
FIG. 2 is a cross-sectional view depicting an example of a cross section of an imaging element 10 in the embodiment of the present technology.

FIG. 2 is a cross-sectional view depicting an example of a cross section of the imaging element 10 in the embodiment of the present technology. In the figure, a depth direction of a semiconductor substrate 12 is depicted downward (Z-coordinate). It is supposed that the semiconductor substrate 12 is composed of a p-type silicon substrate.

A photodiode (PD) 200 includes an n-type impurity region (n-type region) 204, an n-type high-concentration impurity region ($n^+$-type region) 203, and a p-type high-concentration impurity region ($p^+$-type region) 202 which are formed from a back surface side to a front surface side of the semiconductor substrate 12 in order in the inside of the semiconductor substrate 12. The photodiode 200 mainly includes a pn junction as a bonding surface between the $p^+$-type region 202 and the $n^+$-type region 203. A p-type low-impurity concentration region ($p^-$-type region) 205 which is lower in impurity concentration than the $p^+$-type region 202 is formed between the $n^+$-type region 203 constituting the photodiode 200, and a gate insulating film 102. The photodiode 200 is a photoelectric conversion section which is formed in a depth direction of the semiconductor substrate 12, and generates the charges corresponding to the quantity of received light.

A floating diffusion (FD) 300 is formed in a region as an n-type high-concentration impurity region ($n^+$-type region) on a surface side of the semiconductor substrate 12 over the outside of the photodiode 200. The floating diffusion 300 is a charge accumulating section which accumulates the charges generated by the photodiode 200.

A transfer gate (TG) 100 is a gate of the transfer transistor 101 which is arranged between the photodiode 200 and the floating diffusion 300, and transfers the charges in the photodiode 200 to the floating diffusion 300. The transfer gate 100 is formed within the semiconductor substrate 12 via a gate insulating film 102.

Figure 3:
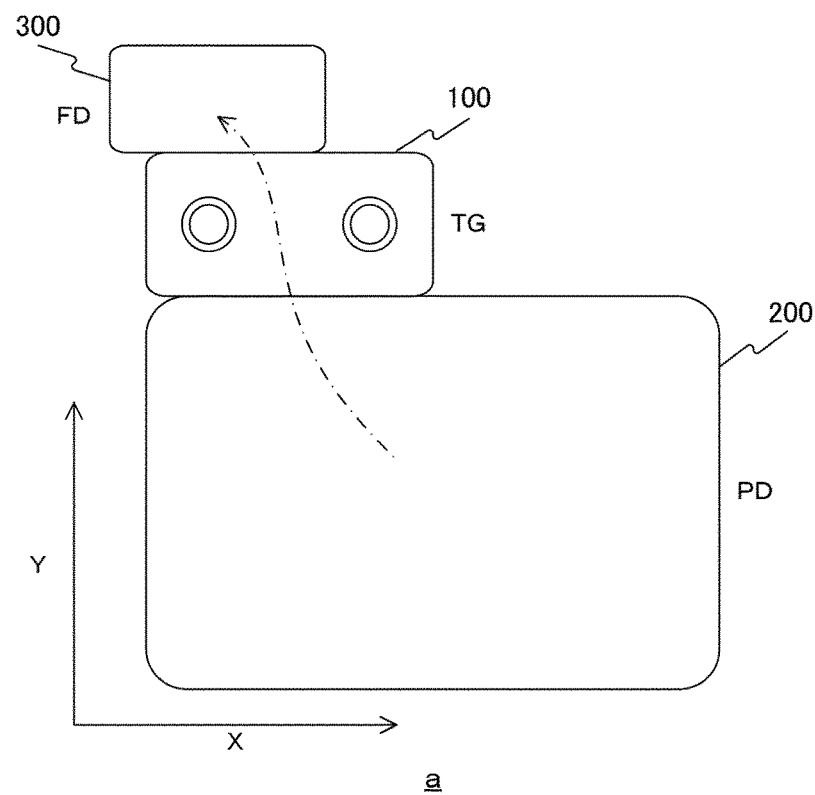
FIG. 3 is a cross-sectional view depicting an example of a cross section, when viewed from another angle, of the imaging element 10 in the embodiment of the present technology.
Figure 3:
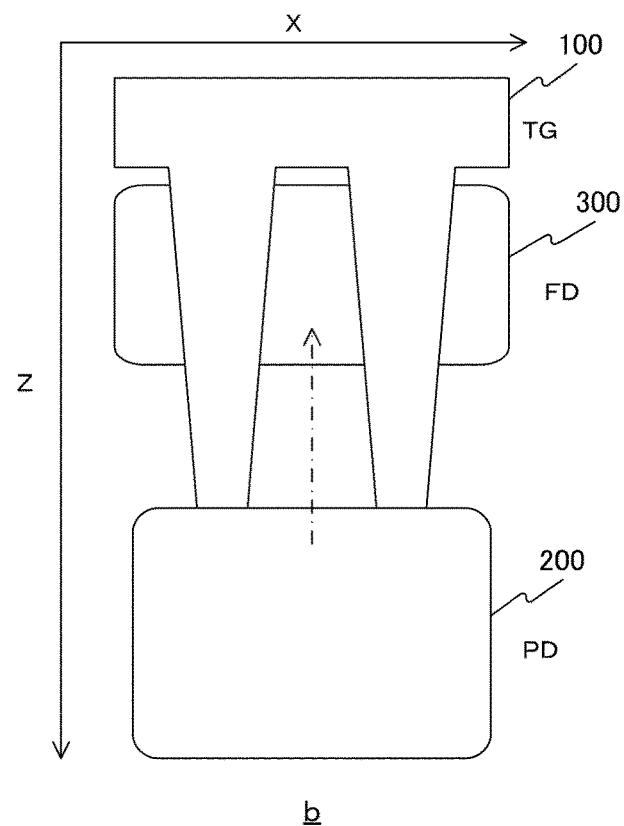

FIG. 3 is a view depicting an example of a cross section, when viewed from another angle, of the imaging element 10 in the embodiment of the present technology. a in the figure is a cross-sectional view in the case where viewed from the back surface side of the semiconductor substrate 12. b in the figure is a cross-sectional view in the case where viewing the floating diffusion 300 from the vertical gate 100.

In FIG. 2 and FIG. 3, a voltage is applied to the transfer gate 100, resulting in that the charges in the photodiode 200 are transferred in a direction indicated by an arrow of a chain line to the floating diffusion 300 via the vertical gate 100.

Figure 4:
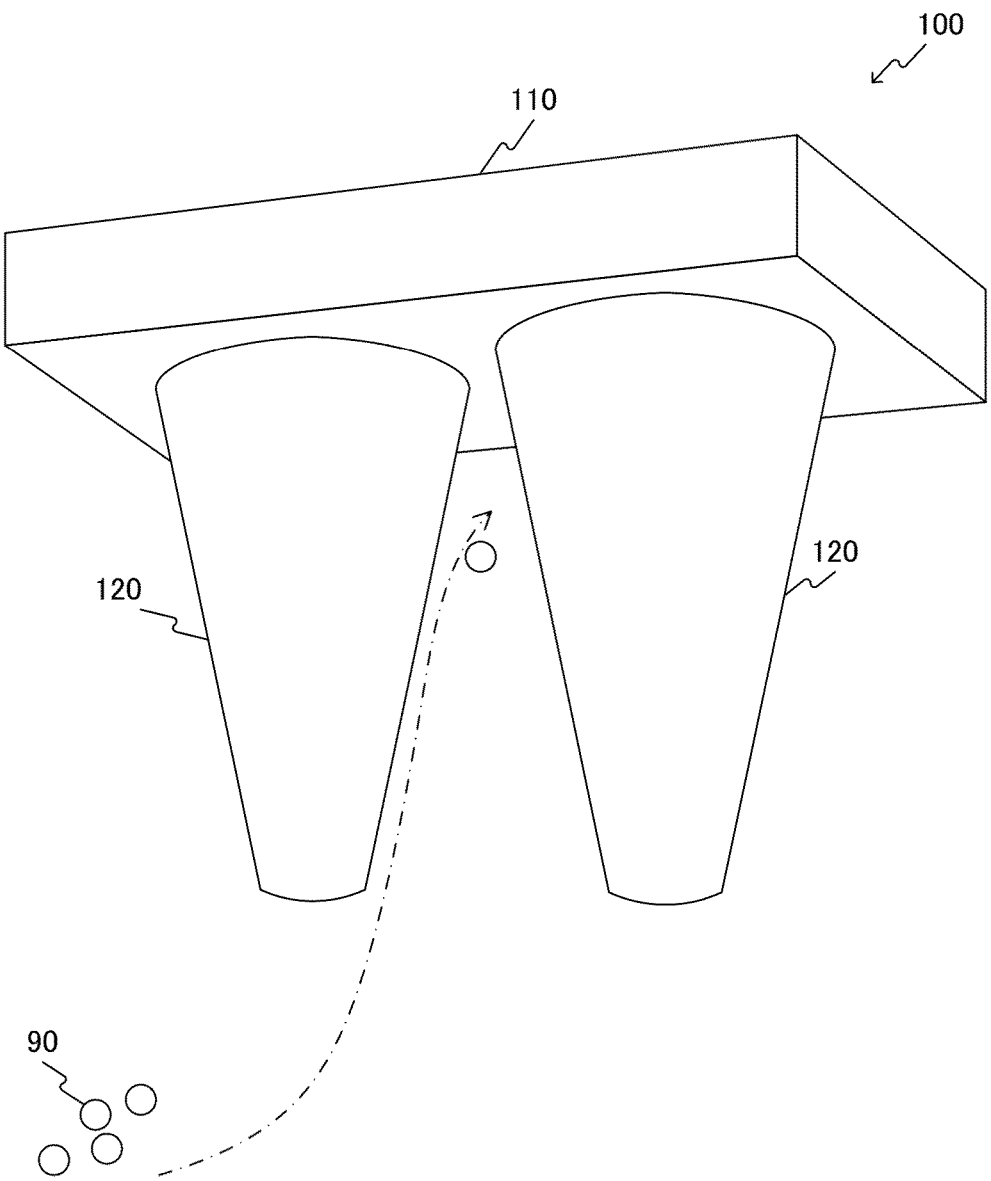
FIG. 4 is a view depicting an example of appearance of a transfer gate 100 in the embodiment of the present technology.

FIG. 4 is a view depicting an example of appearance of the transfer gate 100 in the embodiment of the present technology. The transfer gate 100 includes the transfer gate electrode 110 as a planner electrode, and two vertical gate electrodes 120 which are formed in the depth direction. Charges 90 in the photodiode 200 pass between the two vertical gate electrodes 120 to be transferred to the floating diffusion 300.

Each of the vertical gate electrodes 120 in the embodiment is formed in such a way that a diameter thereof is changed so as to become small in the depth direction of the semiconductor substrate 12. This shape of the diameter results in that with respect to the potential between the two vertical gate electrodes 120, the modulation becomes small in a deep portion, and the modulation becomes large in a shallow portion. Then, a distribution of the potentials causes an electric field to be generated in a depth direction of the vertical gate electrode 120 to enable the satisfactory charge transfer to be performed. That is, in the range in which the modulation powers between the two vertical gate electrodes 120 overlap each other to exert an influence, the charges can be efficiently transferred.

Figure 5:
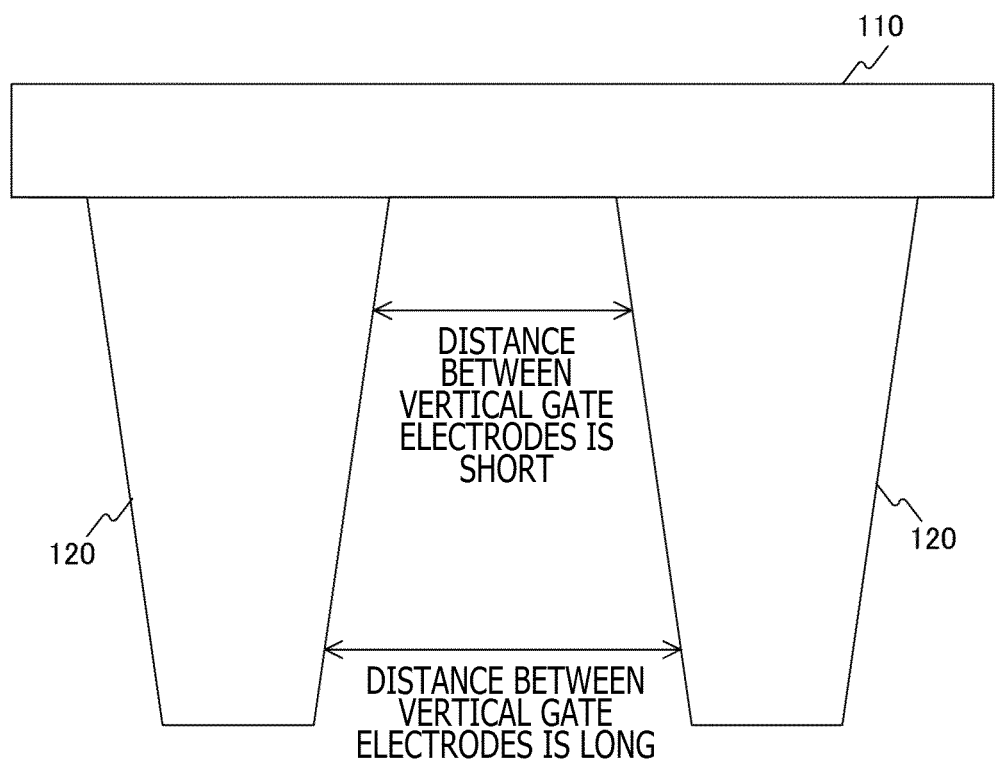
FIG. 5 is a view depicting an example of a cross-sectional view of the transfer gate 100 in the embodiment of the present technology.

FIG. 5 is a view depicting an example of a cross-sectional view of the transfer gate 100 in the embodiment of the present technology. When a distance between the vertical gate electrodes 120 is short, the modulation power increases, so that the potential becomes deep. On the other hand, when the distance between the vertical gate electrodes 120 is long, the modulation power decreases, so that the potential becomes shallow. With this structure, the degree of the modification can be controlled depending on the distance between the two vertical gate electrodes 120, and the shape thereof. That is, in a design of the potential in the vicinity of the vertical gate electrode 120, the distance between the vertical gate electrodes 120, and the shape thereof can be used as parameters used to adjust the way of giving the distribution of the electric fields.

Figure 6:
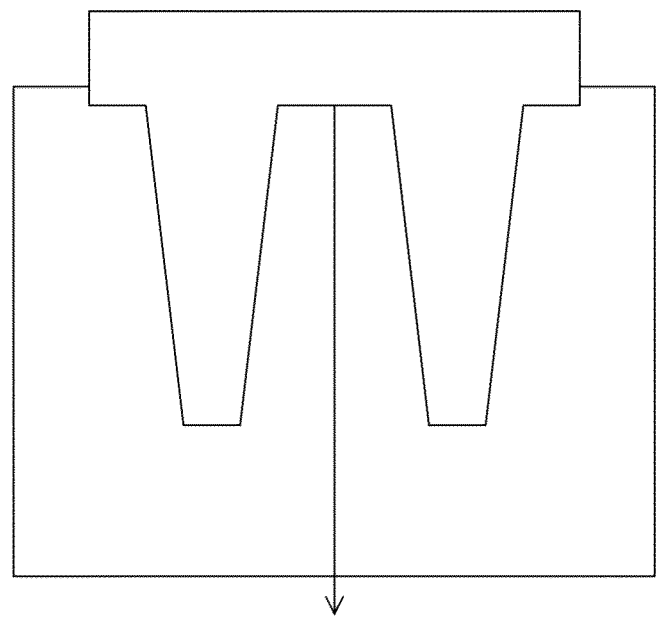
FIG. 6 is a view of assistance in comparing in shape the transfer gate 100 in the embodiment of the present technology and an existing transfer gate with each other.
Figure 6:
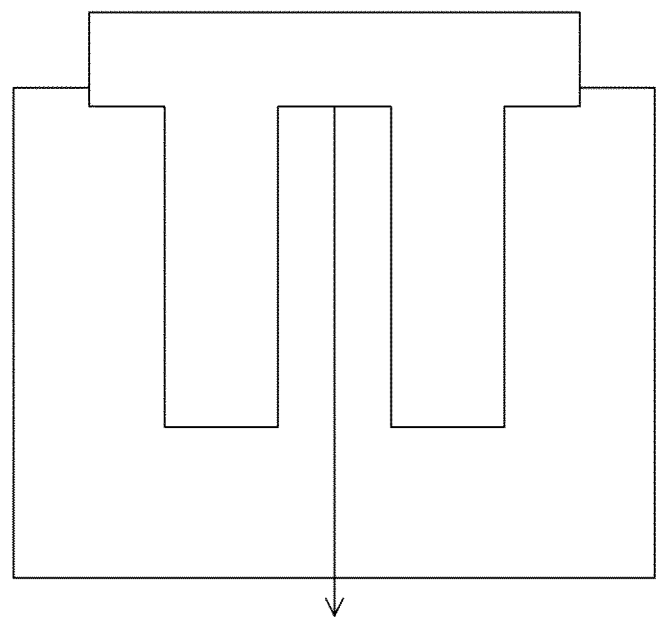

FIG. 6 is a view of assistance in comparing in shape the transfer gate 100 in the embodiment of the present technology, and the existing transfer gate with each other. In a and b of the figure, a downward arrow indicates the depth direction in the semiconductor substrate.

In order to suck up the charges from the deep region to the shallow region of the photodiode, heretofore, the vertical gate electrode has been used. The existing vertical gate electrode, as depicted in b of the figure, has a vertical shape.

In the vertical gate electrode, since when a length thereof becomes long, the electric field near the vertical direction along the vertical gate electrode is hard to generate, the charges become difficult to transfer. In addition, since the modulation range is wider in the structure using two vertical gate electrodes than in the structure using one vertical gate electrode, the charges can be sucked up from the photodiode in the deeper and wider range. However, it is not changed that the electric field in the depth direction is hard to generate.

Then, in the embodiment of the present technology, as depicted in a of the figure, two tapered vertical gate electrodes are used, resulting in that the electric field in the vertical direction is strengthened to enhance the transfer efficiency to facilitate the transfer design.

Figure 7:
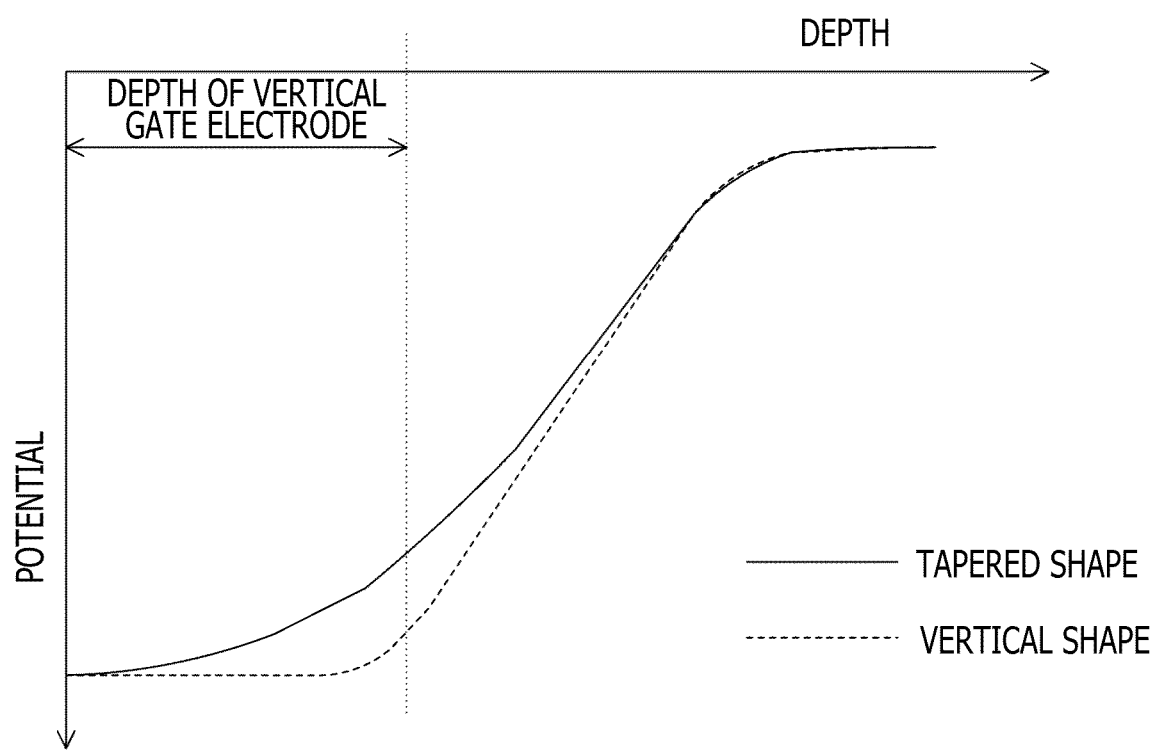
FIG. 7 is a graph of assistance in comparing in potential distribution the transfer gate 100 in the embodiment of the present technology and the existing transfer gate with each other.

FIG. 7 is a graph of assistance in comparing a potential distribution of the transfer gate 100 in the embodiment of the present technology, and that in the existing transfer gate with each other. In the figure, a right-hand direction indicates the depth direction in the semiconductor substrate, and a downward direction indicates the potential.

The potential of the existing vertical gate electrode having the vertical shape is indicated by a dotted line, and the potential of the vertical gate electrode 120 having the tapered shape in the embodiment is indicated by a solid line. It should be noted that in this case, one-dimensional potential in the depth direction in an intermediate point between the two vertical gate electrodes is plotted.

As indicated in this case, in the existing vertical shape, the potential in the vicinity of the vertical gate electrode generates the power source voltage, and the electric field is hardly generated. On the other hand, in the structure having the tapered shape like the embodiment, it is understood that instead of decreasing the modulation in a lower portion of the vertical gate electrode 120, the electric field in the vicinity of the vertical gate electrode 120 is generated.

Figure 8:
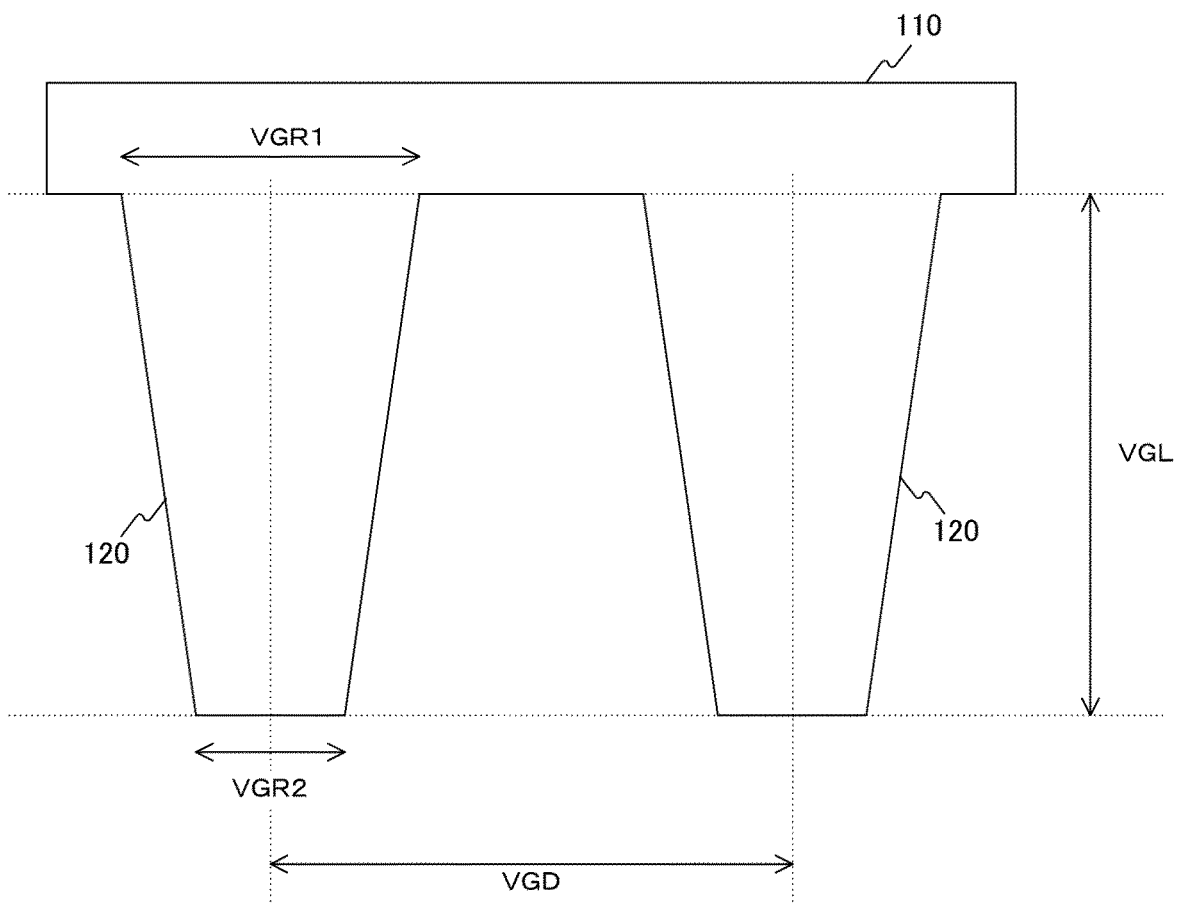
FIG. 8 is a view depicting an example of a size of the transfer gate 100 in the embodiment of the present technology.

FIG. 8 is a view depicting an example of a size of the transfer gate 100 in the embodiment of the present technology. Let us consider a structure in which the two vertical gate electrodes 120 are arranged at a distance VGD, and conduct through a pad type gate electrode 110. However, it is supposed that a length of each of the vertical gate electrodes 120 is VGL, and a shape thereof tapers off along the depth direction. It is also supposed that a thickness of each of the vertical gate electrodes 120 is VGR1 in the thickest portion, and is VGR2 in the thinnest portion.

As the distance VGD between the vertical gate electrodes is shorter, an electric field ratio, in the vicinity of the vertical gate electrode, between the vertical shape and the tapered shape becomes larger. In addition, as the angle of the taper in the vertical gate electrode 120 is larger, the electric field ratio, in the vicinity of the vertical gate electrode, between the vertical shape and the tapered shape becomes larger.

In the case where the taper ratio of 0.02 or more in the depth direction is applied to a structure in which the distance VGD between the vertical gate electrodes is 400 nm or less, and the diameter VGR1 of the vertical gate electrode is 100 nm or more, the effect in which the electric field in the depth direction is strengthened is recognized. Here, the wording "the taper ratio is 0.02" means that, at a depth of 100 nm in the depth direction, the diameter of the vertical gate electrode decreases by 2 nm. In addition, in the case where an applied voltage to the transfer gate 100 is smaller, the strengthening degree of the electric field is increased.

In order to form such a shape, the condition such that at the time of dry etching, gaseous species or a partial pressure is adjusted to generate the taper is used.

As described above, according to the embodiment of the present technology, the electric field is applied to the vicinity of the vertical gate electrode, so that the charges in the photodiode can be efficiently transferred to the floating diffusion.

Modified Changes
(First Modified Change (A Shape in Which a Diameter is Decreased Below a Depth Lower Than a Given Depth))

Figure 9:
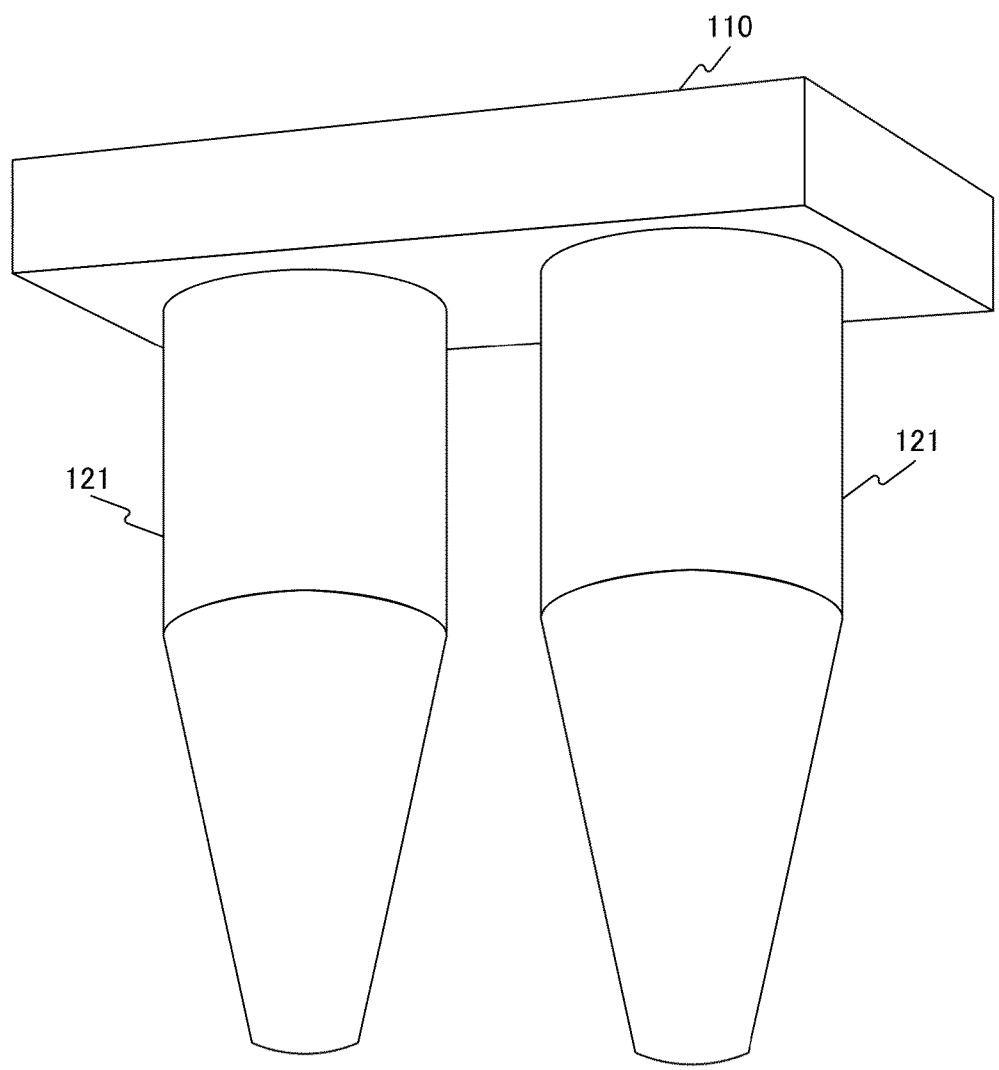
FIG. 9 is a view depicting an example of a structure of a first modified change of the vertical gate electrode in the embodiment of the present technology.

FIG. 9 is a view depicting an example of a structure of a first modified change of the vertical gate electrode in the embodiment of the present technology. In the first modified change, in a vertical gate electrode 121, a diameter is not changed to a given depth of the semiconductor substrate, and is decreased toward the lower side below the given depth in the depth direction. That is, the vertical gate electrode 121 has a structure in which an upper portion has a normal columnar shape, and a lower portion has a tapered shape.

The tapered portion causes the vertical electric field due to the structure to be generated, and the columnar portion causes the electric field due to multistage implantation to be generated. As a result, the charges can be taken out from the deep portion.

(Second Modified Change (a Shape in Which a Diameter is Decreased to a Given Depth))

Figure 10:
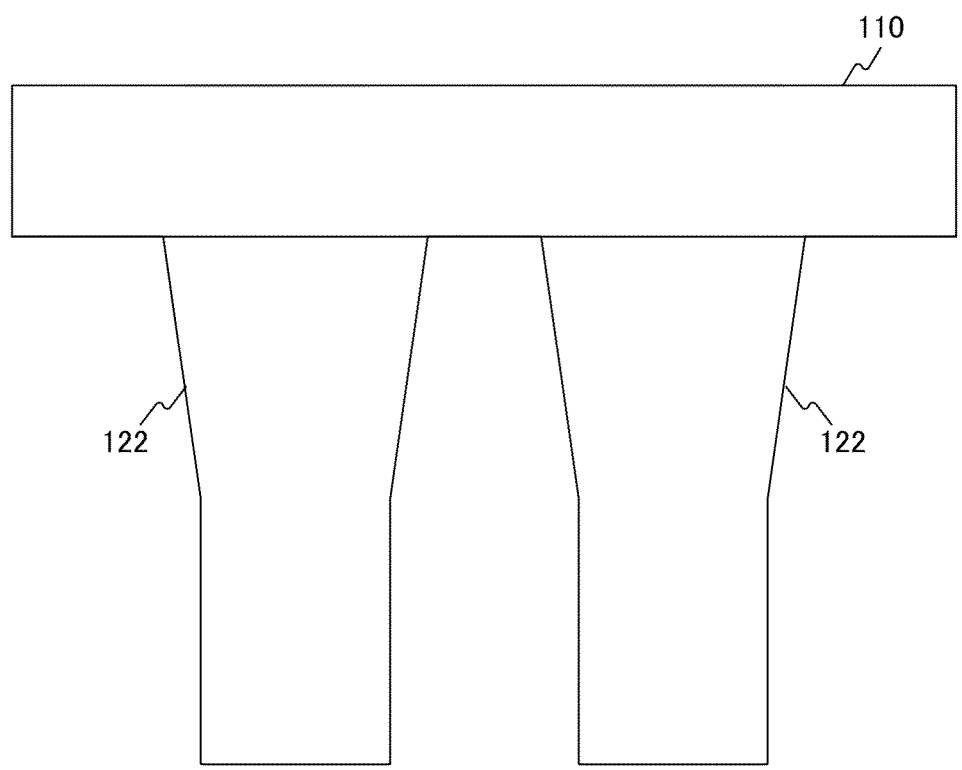
FIG. 10 is a view depicting an example of a structure of a second modified change of the vertical gate electrode in the embodiment of the present technology.

FIG. 10 is a view depicting an example of a structure of a second modified change of the vertical gate electrode in the embodiment of the present technology. In the second modified change, in a vertical gate electrode 122, a diameter is decreased in the depth direction to a given depth of the semiconductor substrate, and is not changed from the given depth. That is, the vertical gate electrode 122 has a structure such that the shallow portion has a tapered shape, and the deep portion has a vertical shape. When the end of the vertical gate electrode is thinned, the case where the modulation range becomes small, and thus it may be impossible to read out the charges from the photodiode may be generated. On the other hand, in this second modified change, the end of the vertical gate electrode is formed into the vertical shape, resulting in that in the shallow portion, the electric field in the depth direction can be generated while the modulation power is maintained.

(Third Modified Change (A Shape in Which a Central Portion Swells))

Figure 11:
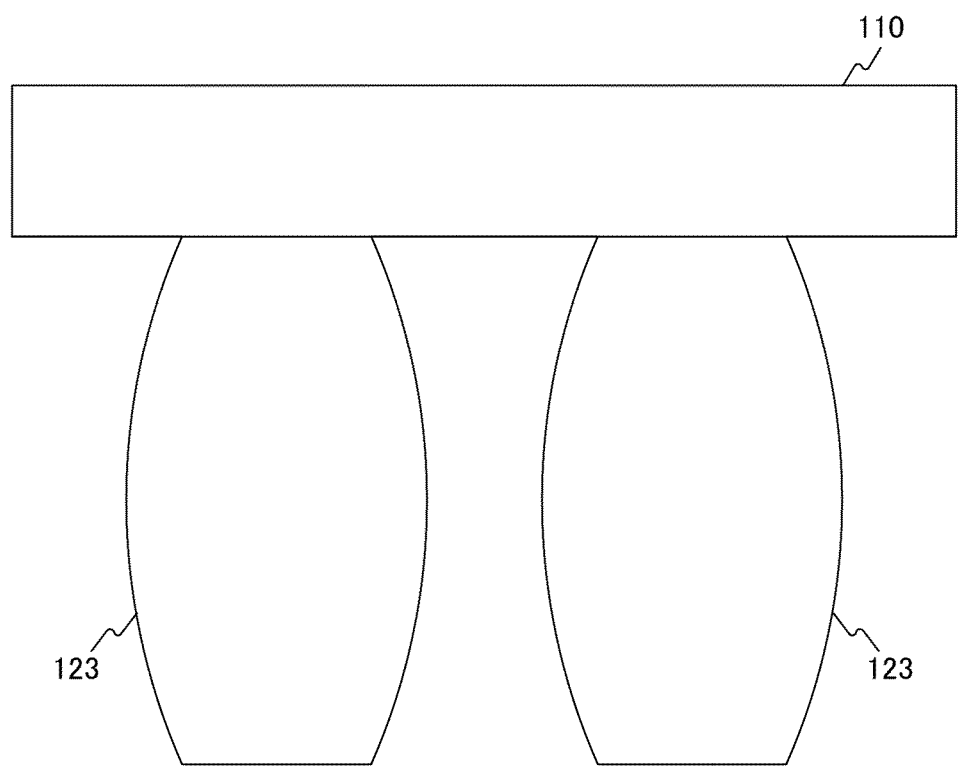
FIG. 11 is a view depicting an example of a structure of a third modified change of the vertical gate electrode in the embodiment of the present technology.

FIG. 11 is a view depicting an example of a structure of a third modified change of the vertical gate electrode in the embodiment of the present technology. In the third modified change, a vertical gate electrode 123 has a shape in which a central portion swells. That is, the vertical gate electrode 123 has the structure in which the central portion swells, and a shallow portion and a deep portion are each thinned. In this structure, the modulation is strengthened in a region in which the central portion of the vertical gate electrode swells. Therefore, a transfer route of the charges does not reach the vicinity of the surface of the vertical gate electrode, but stops at the central portion, resulting in that the charges can be transferred without being influenced by defects in the vicinity of the interface.

(Fourth Modified Change (A Structure in Which a Diameter is Decreased in Steps))

Figure 12:
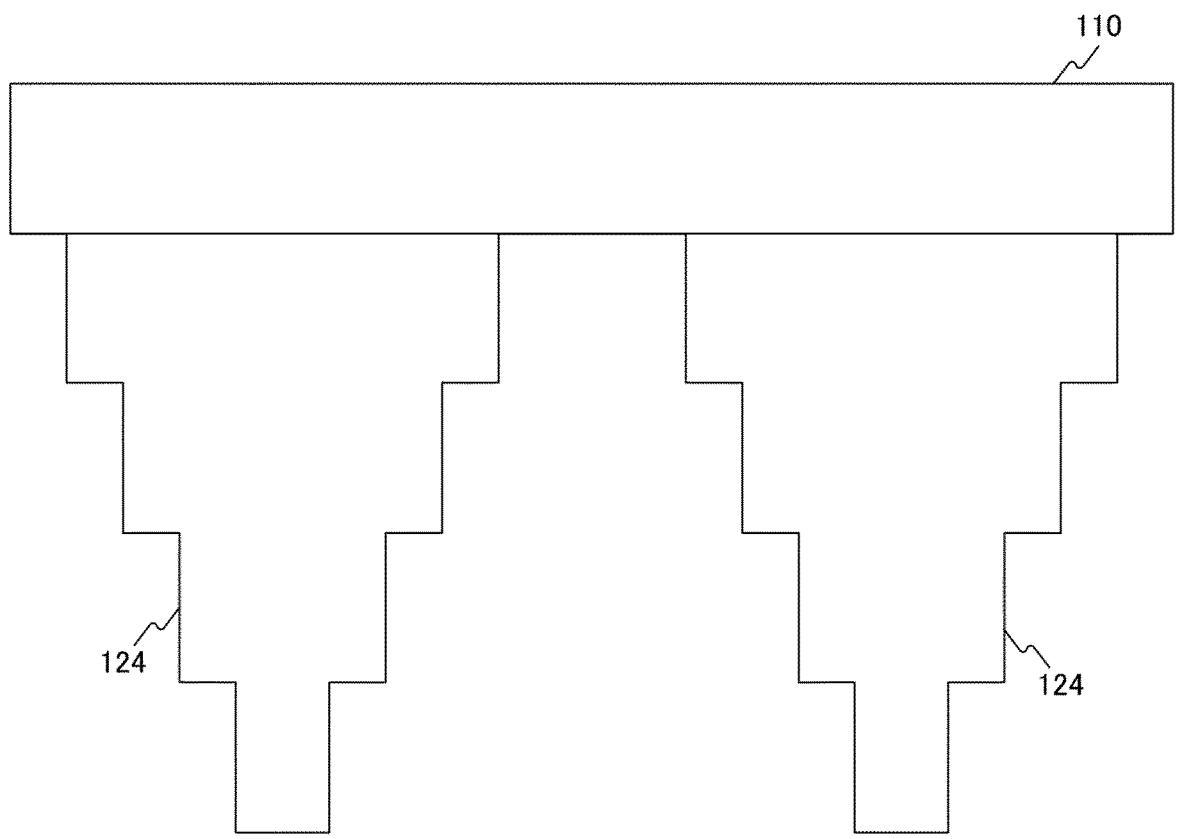
FIG. 12 is a view depicting an example of a structure of a fourth modified change of the vertical gate electrode in the embodiment of the present technology.

FIG. 12 is a view depicting an example of a structure of a fourth modified change of the vertical gate electrode in the embodiment of the present technology. In the fourth modified change, a vertical gate electrode 124 has a shape in which a diameter is decreased in steps. That is, the vertical gate electrode 124 has a structure in which the diameter is changed step by step. A hole having different diameters is dug in several times, thereby enabling the structure to be realized.

(Fifth Modified Change (A Structure Having Different Lengths))

Figure 13:
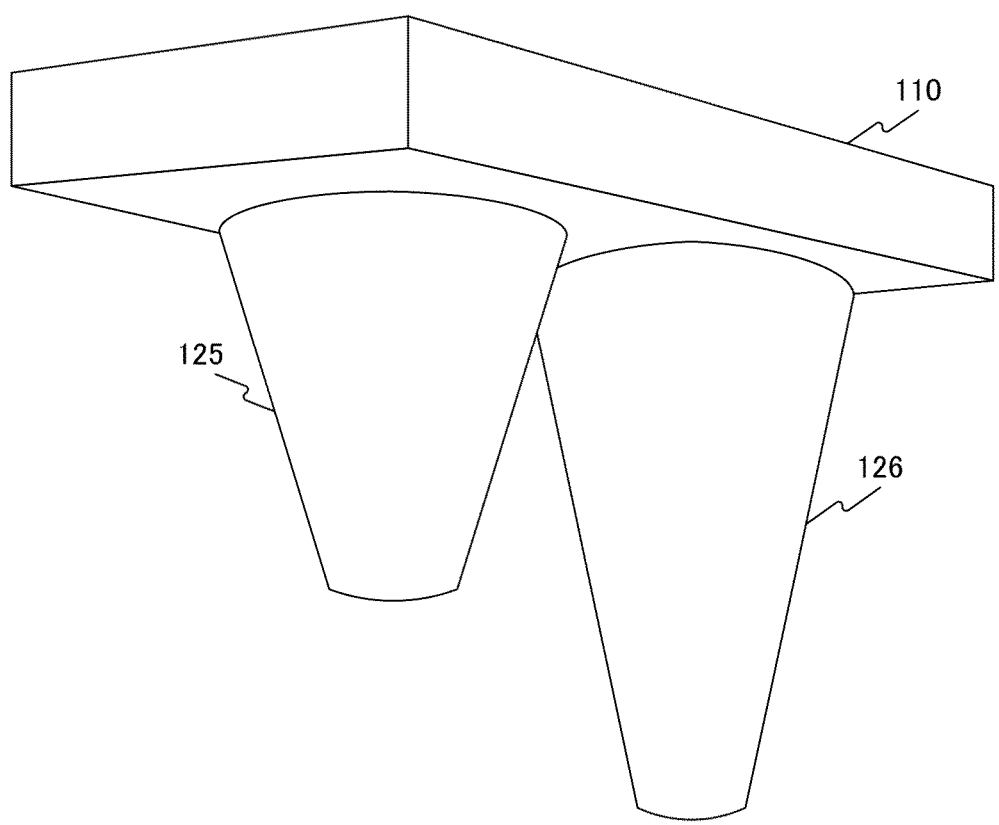
FIG. 13 is a view depicting an example of a structure of a fifth modified change of the vertical gate electrode in the embodiment of the present technology.

FIG. 13 is a view depicting an example of a structure of a fifth modified change of the vertical gate electrode in the embodiment of the present technology. In the fifth modified change, in two vertical gate electrodes 125 and 126, lengths thereof in the depth direction of the semiconductor substrate are different from each other. This state is such that after the length of one of them is changed to adjust the transfer route of the charges, the electric field in the vertical direction can also be applied.

(Sixth Modified Change (A Cross Section Along a Diameter has a Polygonal Shape))

Figure 14:
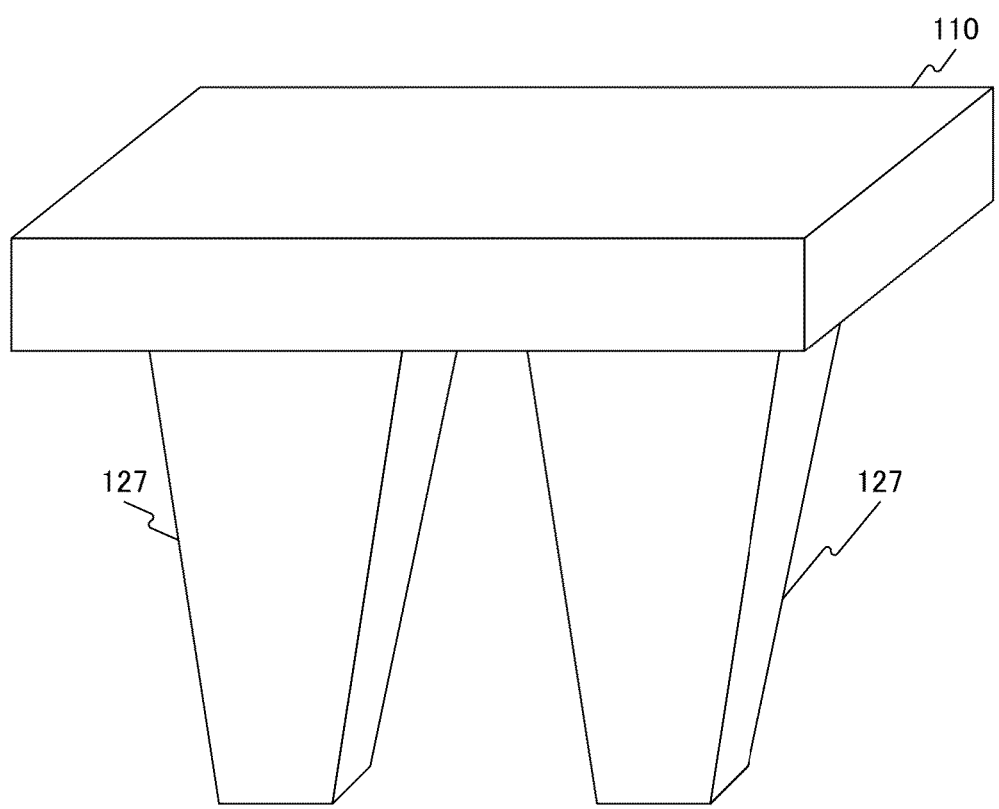
FIG. 14 is a view depicting an example of a structure of a sixth modified change of the vertical gate electrode in the embodiment of the present technology.

FIG. 14 is a view depicting an example of a structure of a sixth modified change of the vertical gate electrode in the embodiment of the present technology. Although in the embodiment described above, the cross section along the diameter has the circular shape, in the sixth modified change, in the vertical gate electrode 127, a cross section along a diameter has a rectangular shape. That is, the cross section has a columnar shape which differs in diameter in the depth direction. In this case, although the example in which the cross section has the rectangular shape, the cross section along the diameter may have a polygonal shape.

(Seventh Modified Change (Transfer Gate Electrodes are Independent Every Vertical Gate Electrode))

Figure 15:
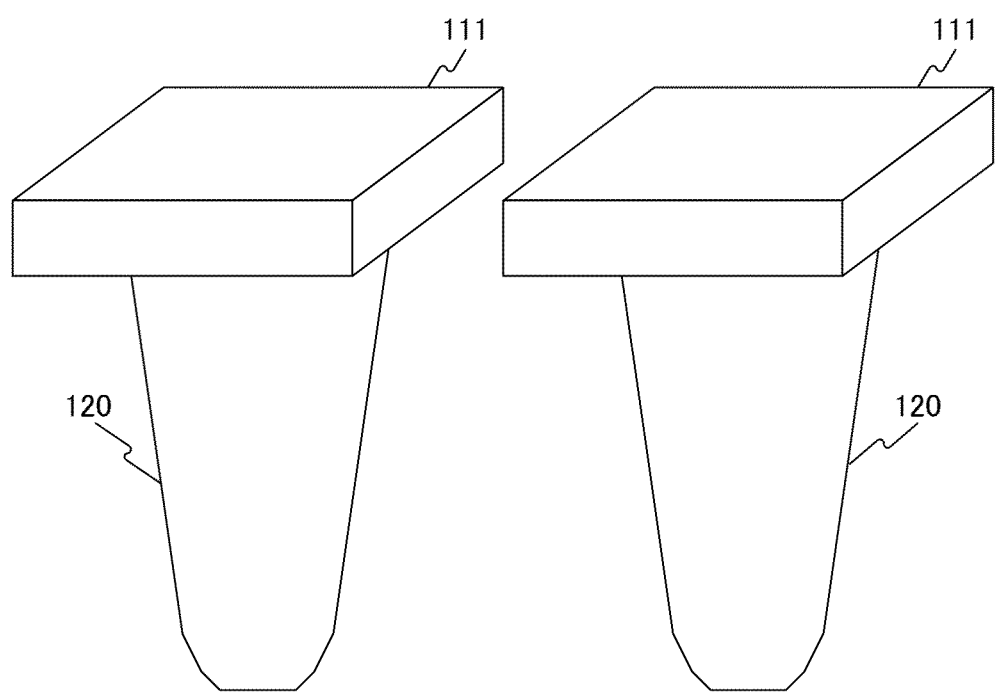
FIG. 15 is a view depicting an example of a structure of a seventh modified change of the vertical gate electrode in the embodiment of the present technology.

FIG. 15 is a view depicting an example of a structure of a seventh modified change of the vertical gate electrode in the embodiment of the present technology. In the seventh modified change, transfer gate electrodes 111 are separately provided so as to correspond to the vertical gate electrodes 120, respectively. That is, the transfer gate electrodes 111 have structures which are independently of each other so as to correspond to a plurality of the vertical gate electrodes 120. Since in this structure, the transfer gate electrodes 111 are electrically separated from each other so as to correspond to a plurality of the vertical gate electrodes 120, respectively, different voltages can be applied to the respective vertical gate electrodes 120. As a result, the transfer route can be changed or adjusted by a timing of the voltage application. For example, a first state in which the right transfer gate is turned ON and the left transfer gate is turned OFF, and a second state in which the left transfer gate is turned ON and the right transfer gate is turned OFF are repeated, thereby enabling the charges to be transferred by the reverse transfer. Naturally, in this structure as well, the same voltage may also be applied to both of them.

(Eighth Modified Change (Three Vertical Gate Electrodes))

Figure 16:
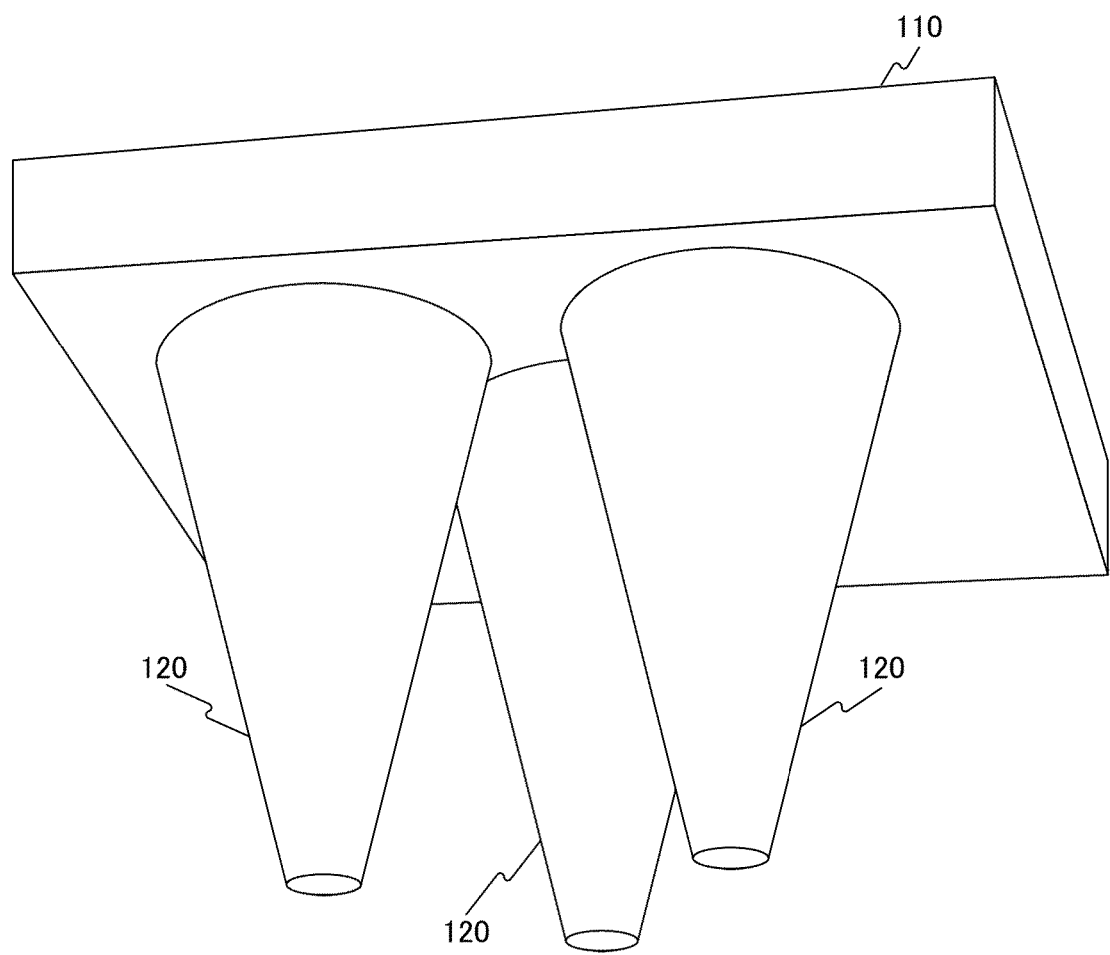
FIG. 16 is a view depicting an example of a structure of an eighth modified change of the vertical gate electrode in the embodiment of the present technology.

FIG. 16 is a view depicting an example of a structure of an eighth modified change of the vertical gate electrode in the embodiment of the present technology. Although in the embodiment described above, the two vertical gate electrodes 120 are provided, in the eighth modified change, three vertical gate electrodes 120 are provided. That is, there is no restriction in the number of vertical gate electrodes 120, and three or more vertical gate electrodes 120 may be provided if necessary. As a result, the central potential is made deeper, resulting in that the electric field can be further generated in the depth direction.

(Ninth Modified Change (A Cross Section has a Square U-Shape))

Figure 17:
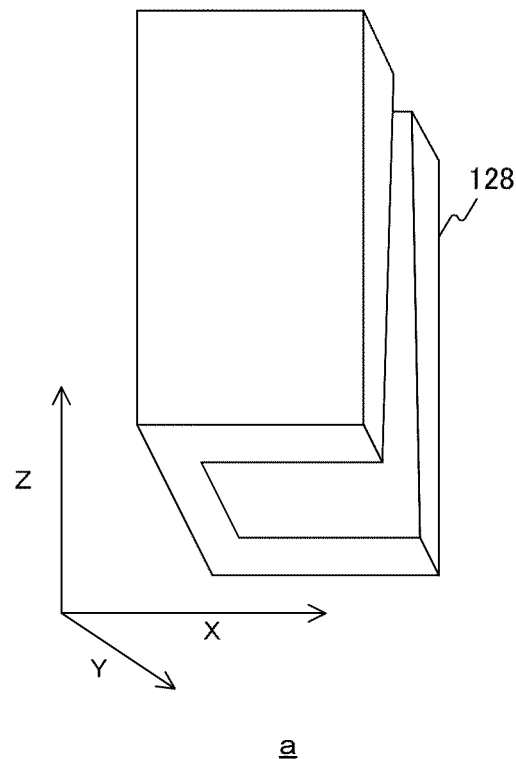
FIG. 17 is a view depicting an example of a structure of a ninth modified change of the vertical gate electrode in the embodiment of the present technology.
Figure 17:
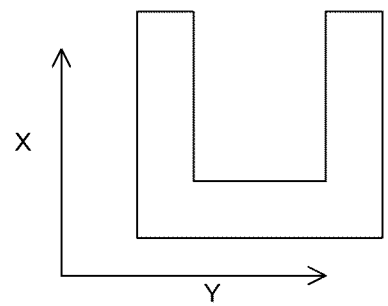
Figure 17:
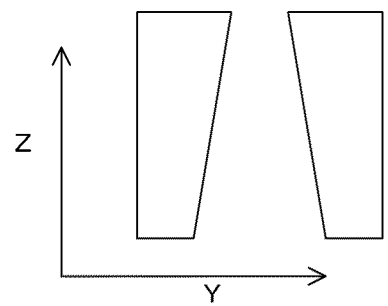

FIG. 17 is a view depicting an example of a structure of a ninth modified change of the vertical gate electrode in the embodiment of the present technology. Although in the embodiment described above, the example in which a plurality of vertical gate electrodes 120 is separately arranged has been described, in the ninth modified change, parts of vertical gate electrodes 128 are connected to each other, and a shape is such that a cross section has a squared U-shape and becomes small in the depth direction of the semiconductor substrate. That is, the electrode structure is such that the thickness of the squared U-shape becomes thicker from a lower portion to an upper portion, and a silicon portion between them becomes narrower from the lower portion to the upper portion. In this case as well, since the electric field is generated in the depth direction in the principle similar to that of the embodiment described above, the charges can be transferred.

(Tenth Modified Change (a Donut Cylindrical Shape))

Figure 18:
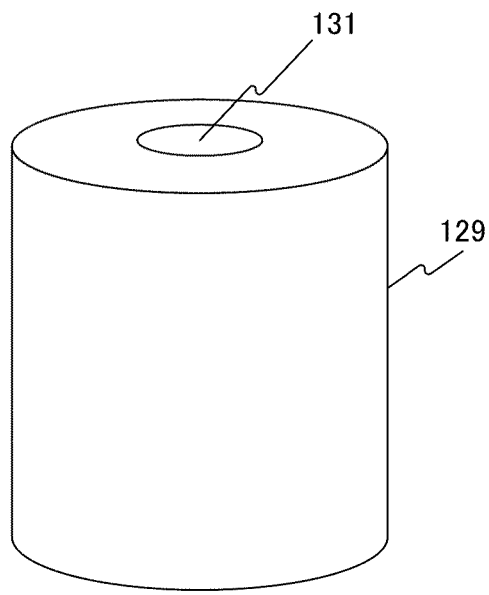
FIG. 18 is a view depicting an example of a structure of a tenth modified change of the vertical gate electrode in the embodiment of the present technology.
Figure 18:
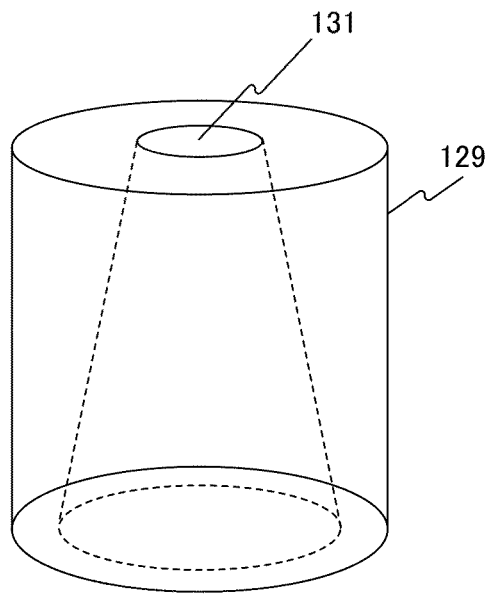

FIG. 18 is a view depicting an example of a structure of a tenth modified change of the vertical gate electrode in the embodiment of the present technique. In the tenth modified change, a vertical gate electrode 129 forms a donut cylindrical shape, and thus has a shape in which a cross-sectional area becomes smaller in the depth direction of the semiconductor substrate. In a lower portion, the modulation becomes weak because an inter-electrode distance is long, and in an upper portion, the modulation becomes strong because the inter-electrode distance is short. As a result, the electric field can be generated in the vertical direction. For forming this structure, the etching is performed in such a way that the diameter is changed from the lower portion to the upper portion.

As described above, according to the embodiment and modified changes of the present technology, the vertical gate electrode structure tapered in the depth direction is used, resulting in that the transfer electric field can be generated in the depth direction and the charges can be read out from the deep portion. As a result, even in the structure in which the vertical gate electrode is lengthened, the charges are easy to read out, and an amount of saturated charges can be generated in the deep portion of the photodiode. In addition, the parameters with respect to the tapered shape are adjusted, resulting in that the modulation amount and electric field in the vicinity of the vertical gate electrode can be controlled. For this reason, the potential at the time of the transfer can be adjusted by the shape of the vertical gate electrode without revising the potential design using the implantation.

It should be noted that the embodiment described above depicts the example for embodying the present technology, and the matters in the embodiment and the invention specific matters in CLAIMS have a correspondence relationship. Likewise, the invention specific matters in CLAIMS, and the matters in the embodiment of the present technology to which the same names as those in the invention specific matters in CLAIMS are added have a correspondence relationship. However, the present technology is by no means limited to the embodiment, and various changes are made for the embodiment without departing from the subject matters, thereby enabling the present technology to be embodied.

It should be noted that the effect described in the present description is merely an exemplification, and is by no means limited, and other effects may be offered.

It should be noted that the present technology can also adopt the following constitutions.

(1)

A solid-state imaging element including:
  a photoelectric conversion section formed in a depth direction of a semiconductor substrate and generating charges corresponding to a quantity of received light;
  a charge accumulating section accumulating the charges generated by the photoelectric conversion section; and
  a transfer gate transferring the charges generated by the photoelectric conversion section to the charge accumulating section,
  in which the transfer gate includes a plurality of vertical gate electrodes which is filled to a predetermined depth from an interface of the semiconductor substrate, and at least a part of a diameter is different in the depth direction of the semiconductor substrate.

(2)

The solid-state imaging element according to (1) described above, in which the plurality of vertical gate electrodes has a shape whose diameter becomes small in the depth direction of the semiconductor substrate.

(3)

The solid-state imaging element according to (1) or (2) described above, in which the plurality of vertical gate electrodes has a shape whose diameter becomes small at a taper ratio of 0.02 or more in the depth direction of the semiconductor substrate.

(4)

The solid-state imaging element according to (1) described above, in which the plurality of vertical gate electrodes has a shape whose diameter is not changed to a given depth of the semiconductor substrate, and the diameter is decreased toward the lower side below the given depth in the depth direction.

(5)

The solid-state imaging element according to (1) described above, in which the plurality of vertical gate electrodes has a shape whose diameter is decreased toward the lower side below a given depth in the depth direction, and the diameter is not changed from the given depth.

(6)

The solid-state imaging element according to (1) described above, in which the plurality of vertical gate electrodes has a shape in which a central portion in the depth direction of the semiconductor substrate swells, and a shallow portion and a deep portion are thin.

(7)

The solid-state imaging element according to (1) described above, in which in the plurality of vertical gate electrodes, the diameter becomes small in steps in the depth direction of the semiconductor substrate.

(8)

The solid-state imaging element according to any one of (1) to (7) described above, in which in the plurality of vertical gate electrodes, lengths thereof in the depth direction of the semiconductor substrate are different from one another.

(9)

The solid-state imaging element according to any one of (1) to (8) described above, in which in the plurality of vertical gate electrodes, a cross section along the diameter has a polygonal shape.

(10)

The solid-state imaging element according to any one of (1) to (9) described above, in which the gate electrode of the transfer gate is electrically separated from one another so as to correspond to the plurality of vertical gate electrodes, respectively.

(11)

The solid-state imaging element according to (1) described above, in which the plurality of vertical gate electrodes has a shape whose parts are connected to each other to have a squared U-shape in cross section, and in which a cross-sectional area becomes small in the depth direction of the semiconductor substrate.

(12)

The solid-state imaging element according to (1) described above, in which the plurality of vertical gate electrodes forms a donut cylindrical shape and has a shape whose cross-sectional area becomes small in the depth direction of the semiconductor substrate.

(13)

An electronic apparatus, including:
a solid-state imaging element including a photoelectric conversion section formed in a depth direction of a semiconductor substrate and generating charges corresponding to a quantity of received light,
a charge accumulating section accumulating the charges generated by the photoelectric conversion section, and
a transfer gate having a plurality of vertical gate electrodes which is filled to a given depth from an interface of the semiconductor substrate and at least a part of a diameter is different in the depth direction of the semiconductor substrate, thereby transferring the charges in the photoelectric conversion section to the charge accumulating section; and
a signal processing circuit processing an output signal from the solid-state imaging element.

REFERENCE SIGNS LIST

10 Imaging element
11 Pixel
12 Semiconductor substrate
20 Vertical drive circuit
30 Horizontal drive circuit
40 Control circuit
50 Column signal processing circuit
60 Output circuit
100 Transfer Gate, Transmission Gate (TG)
101 Transfer transistor
102 Gate insulating film
110, 111 Transfer gate electrode
120 to 129 Vertical gate electrode
200 Photodiode (PD)
300 Floating Diffusion (FD)

What is claimed is:

1. A light detecting device, comprising:
a photoelectric conversion section formed in a semiconductor substrate and generating charges corresponding to a quantity of received light;
a charge accumulating section accumulating the charges generated by the photoelectric conversion section; and
a transfer gate transferring the charges generated by the photoelectric conversion section to the charge accumulating section,
wherein a first surface of the semiconductor substrate is a light incident surface and a second surface of the semiconductor substrate is opposite to the first surface of the semiconductor substrate,
wherein the transfer gate comprises a plurality of vertical gate electrodes disposed in the semiconductor substrate and a transfer gate electrode disposed on the plurality of vertical gate electrodes,
wherein the second surface of the semiconductor substrate is between the plurality of vertical gate electrodes and the transfer gate electrode,
wherein a diameter of at least a part of at least one of the plurality of vertical gate electrodes varies in a depth direction of the semiconductor substrate, and
wherein a first distance between adjacent vertical gate electrodes of the plurality of vertical gate electrodes at respective central portions thereof in the depth direction is shorter than a second distance between adjacent vertical gate electrodes of the plurality of vertical gate electrodes at respective top portions thereof in the depth direction and a third distance between adjacent vertical gate electrodes of the plurality of vertical gate electrodes at respective bottom portions thereof in the depth direction.

2. The light detecting device according to claim 1, wherein the transfer gate electrode is a planar electrode.

3. The light detecting device according to claim 1, wherein a same voltage is configured to be applied to each vertical gate electrode in the plurality of vertical gate electrodes.

4. The light detecting device according to claim 1, wherein a distance between respective adjacent vertical gate electrodes of the plurality of vertical gate electrodes is 400 nm or less.

5. The light detecting device according to claim 1, wherein a largest diameter of each vertical gate electrode in the plurality of vertical gate electrodes is 100 nm or more.

6. An electronic apparatus, comprising:
a light detecting device, comprising:
a photoelectric conversion section formed in a semiconductor substrate and generating charges corresponding to a quantity of received light;
a charge accumulating section accumulating the charges generated by the photoelectric conversion section; and
a transfer gate transferring the charges generated by the photoelectric conversion section to the charge accumulating section,
wherein a first surface of the semiconductor substrate is a light incident surface and a second surface of the semiconductor substrate is opposite to the first surface of the semiconductor substrate,
wherein the transfer gate comprises a plurality of vertical gate electrodes disposed in the semiconductor substrate and a transfer gate electrode disposed on the plurality of vertical gate electrodes,
wherein the second surface of the semiconductor substrate is between the plurality of vertical gate electrodes and the transfer gate electrode,
wherein at least a part of a diameter of at least a part of at least one of the plurality of vertical gate electrodes varies in a depth direction of the semiconductor substrate, and
wherein a first distance between adjacent vertical gate electrodes of the plurality of vertical gate electrodes at respective central portions thereof in the depth direction is shorter than a second distance between adjacent vertical gate electrodes of the plurality of vertical gate electrodes at respective top portions thereof in the depth direction and a third distance between adjacent vertical gate electrodes of the plurality of vertical gate electrodes at respective bottom portions thereof in the depth direction; and
a signal processing circuit processing an output signal from the light detecting device.

7. The electronic apparatus according to claim 6, wherein the transfer gate electrode is a planar electrode.

8. The electronic apparatus according to claim 6, wherein a same voltage is configured to be applied to each vertical gate electrode in the plurality of vertical gate electrodes.

* * * * *